United States Patent
Oota

(10) Patent No.: US 8,867,222 B2
(45) Date of Patent: Oct. 21, 2014

(54) ELECTRIC CONTROL DEVICE

(75) Inventor: Shinsuke Oota, Kariya (JP)

(73) Assignee: Denso Corporation, Kariya (JP)

(*) Notice: Subject to any disclaimer, the term of this patent is extended or adjusted under 35 U.S.C. 154(b) by 369 days.

(21) Appl. No.: 13/202,855

(22) PCT Filed: Sep. 27, 2010

(86) PCT No.: PCT/US2010/005782
§ 371 (c)(1),
(2), (4) Date: Aug. 23, 2011

(87) PCT Pub. No.: WO2011/045898
PCT Pub. Date: Apr. 21, 2011

(65) Prior Publication Data
US 2012/0039054 A1   Feb. 16, 2012

(30) Foreign Application Priority Data

Oct. 15, 2009  (JP) .................................. 2009-238435
Sep. 2, 2010  (JP) .................................. 2010-196750

(51) Int. Cl.
*H05K 5/03*  (2006.01)
*H05K 5/00*  (2006.01)

(52) U.S. Cl.
CPC .................................... *H05K 5/0052* (2013.01)
USPC ............ 361/759; 361/736; 361/752; 174/563; 174/564

(58) Field of Classification Search
CPC .................................................. H05K 5/0052
USPC ........ 174/50.51, 50.54, 520, 563, 564, 138 E, 174/138 G; 361/720, 728, 736, 752, 759, 361/809, 810
See application file for complete search history.

(56) References Cited

U.S. PATENT DOCUMENTS 5,531,345 A   7/1996   Nakamura et al.
6,185,100 B1 *   2/2001   Bentz et al. .................... 361/704
(Continued)

FOREIGN PATENT DOCUMENTS

JP   H07-297561   11/1995
JP   2000-247277   9/2000
(Continued)

OTHER PUBLICATIONS

Office Action (3 pages) dated Jan. 17, 2013 issued in corresponding Korean Application No. 10-2011-7029465 and English translation (3 pages).

(Continued)

*Primary Examiner* — Anatoly Vortman
*Assistant Examiner* — Jacob Crum
(74) *Attorney, Agent, or Firm* — Nixon & Vanderhye P.C.

(57) ABSTRACT

An electric control device includes: an accommodation element (10) having an opening and a bottom; a cover element (20) for covering the opening of the accommodation element (10) so that accommodation space (15) is formed between the cover element (20) and the accommodation element (10); a hook (11) integrated with the accommodation element (10) for swaging the cover element (20); and a control element (30) formed in the accommodation space (15), wherein an electric element (32-35) is arranged on a substrate (31) so that the control element (30) is prepared. The substrate (31) includes a notch concavity (311) on a periphery of the substrate (31) so as to face the hook (11).

7 Claims, 10 Drawing Sheets

(56) References Cited

U.S. PATENT DOCUMENTS

| | | | |
|---|---|---|---|
| 6,757,155 B2 * | 6/2004 | Koike et al. | 361/600 |
| 7,430,129 B1 * | 9/2008 | Peng | 361/807 |
| 7,635,046 B2 * | 12/2009 | Tominaga et al. | 180/444 |
| 8,208,264 B2 * | 6/2012 | Heim | 361/752 |
| 2007/0230137 A1 | 10/2007 | Inagaki | |

FOREIGN PATENT DOCUMENTS

| | | |
|---|---|---|
| JP | P2002-134939 A | 5/2002 |
| JP | P2004-186039 A | 7/2004 |
| JP | 2004-316937 | 11/2004 |
| JP | 2004-319849 | 11/2004 |
| JP | 2004-356524 | 12/2004 |
| JP | 2006-253262 | 9/2006 |
| JP | P2006-287065 A | 10/2006 |

OTHER PUBLICATIONS

Japanese Office Action dated Feb. 17, 2012, issued in corresponding Japanese Application No. 2010-196750 with English Translation.

Office Action (6 pages) dated Jun. 5, 2013, issued in corresponding Chinese Application No. 201080013102.7 and English translation (8 pages).

International Search Report and Written Opinion of PCT/JP2010/005782, mailed Nov. 9, 2010.

International Search Report and Written Opinion of PCT/JP2010/005783, mailed Nov. 9, 2010.

Oota, U.S. Appl. No. 13/202,848, filed Aug. 23, 2011.

Japanese Office Action dated Aug. 16, 2012, issued in corresponding Japanese Application No. 2010-196750 with English Translation.

* cited by examiner

ELECTRIC CONTROL DEVICE

CROSS REFERENCE TO RELATED APPLICATIONS

This application is the U.S. national phase of International Application No. PCT/JP2010/005782 filed on Sep. 27, 2010, which designated the U.S. and claims priority to Japanese Patent Applications No. 2009-238435 filed on Oct. 15, 2009, and No. 2010-196750 filed on Sep. 2, 2010, the disclosures of each of which are incorporated herein by reference.

TECHNICAL FIELD

The present invention relates to an electric control device.

BACKGROUNDS ART

Recently, there are many vehicles, each of which mounts an electric power steering system (i.e., EPS) for assisting a driver to operate a steering wheel with using a motor. In this case, an electric control device for controlling the motor is mounted on the vehicle.

The electric control device is mounted, for example, near a column shaft. In this case, liquid such as dew (e.g., condensation water) or wash fluid for a compartment may drop on the electric control device, so that the liquid penetrates into the electric control device via a clearance between a cover element and an accommodation element. Thus, a system of the device may shut down. In order to protect the device from wetting with water, it is proposed that a sealing member is filled between a casing (as the accommodation element) and a cover (as the cover element) so that the device is sealed (in, for example, JP-A-2007-273807 and corresponding US 2007/0230137).

Alternatively, the electric control device may be packed with a water-resistant sheet.

However, each of a method for filling with the sealing member and a method for packing with the water-resistant sheet provides high manufacturing cost, and further, low workability. Further, it is difficult to obtain a complete water protection effect even when the above water protection method is executed.

DISCLOSURE OF THE INVENTION

In view of the above-described problem, it is an object of the present disclosure to provide an electric control device having a simple structure for restricting liquid from adhering to a substrate.

An electric control device includes: an accommodation element as a casing having an opening and a bottom; a cover element for covering the opening of the accommodation element so that accommodation space is formed between the cover element and the accommodation element; a hook integrated with the accommodation element for swaging the cover element; and a control element formed in the accommodation space, wherein the control element is prepared such that the electric element is arranged on the substrate. The substrate includes a notch concavity on a periphery of the substrate so as to face the hook.

Thus, even if the liquid penetrates into the accommodation element via the clearance between the cover element and the hook, the liquid drops in the notch concavity, which is formed at a position corresponding to the hook. Accordingly, even if the liquid penetrates to the inside of the accommodation element, the liquid is restricted from adhering to the substrate. Accordingly, operation failure of the electric control device caused by the liquid that has penetrated to the inside of the accommodation element is restricted.

Alternatively, a width of the notch concavity in a peripheral direction of the substrate may be larger than a width of the hook in a peripheral direction around the opening.

Alternatively, the cover element may include an engagement member for engaging with the accommodation element and a contact periphery portion for contacting a peripheral surface around the opening of the accommodation element. A hook receiving surface is formed at a position of the contact periphery portion corresponding to the hook, and is concaved to a plane including an outer wall of the engagement member facing an inner wall of the accommodation element. A width of the notch concavity in the peripheral direction of the substrate is larger than a width of the hook receiving surface in the peripheral direction of the contact periphery portion. Thus, even if the liquid penetrates to the inside of the accommodation element via the clearance between the accommodation element and the cover element along with the hook receiving surface, the liquid is restricted from adhering to the substrate.

Alternatively, the contact periphery portion may include a step surface on both sides of the hook receiving surface in a peripheral direction of the contact periphery portion. A vertical line passing through an intersection point among an ideal plane including the step surface, an ideal plane including the hook receiving surface and an ideal plane including an end surface of the periphery around the opening of the accommodation element is disposed on an outside of a projection of the substrate with the notch concavity in the vertical direction. Accordingly, even if the liquid penetrates to the inside of the accommodation element via the clearance between the accommodation element and the cover element near the hook, and the liquid drops along with the vertical line, the liquid is restricted from adhering to the substrate.

Alternatively, a groove bottom portion of the notch concavity may be disposed on a center side of the substrate from a vertical line passing through a top of the engagement member on an accommodation element side. Thus, even if the liquid penetrates to the inside of the accommodation element via the clearance between the hook and the cover element, and the penetrated liquid flows to the center side of the cover element, the liquid is restricted from adhering to the substrate.

Alternatively, the substrate may include a power region in which a driving current for driving a control object flows, a control region in which a control current for controlling the driving current flows, and a sub power region for accumulating and discharging current. The notch concavity is formed on at least one periphery of the control region and the sub power region. Here, for example, a region in which a power module is arranged is defined as the power region. A region in which a micro computer is arranged is defined as the control region. A region in which a capacitor is arranged is defined as the sub power region. Thus, the notch concavity is not formed in the power region, so that heat mass of the substrate in the power region is secured. Accordingly, heat radiation performance of the substrate in the power region is maintained.

Alternatively, a liquid drop introduction member may be formed on both sides of a position of the engagement member corresponding to the hook. A projection of the liquid drop introduction member in the vertical direction is disposed on an outside, along with a horizontal direction, of a projection of the substrate having the notch concavity in the vertical direction. Thus, even if the liquid penetrates to the inside of the electric control device, via the clearance between the hook and the cover element, the liquid passes through a concavity space, formed by the notch concavity, from the liquid drop introduction member of the engagement member, or the liquid drops on the outside of the substrate. Accordingly, the liquid passes through the concavity space formed by the notch concavity along with the liquid drop introduction member without dropping on the substrate, or the liquid drops on the outside of the substrate. Thus, operation failure of the electric control device caused by the liquid adhered to the substrate is restricted.

BRIEF DESCRIPTION OF THE DRAWINGS

The above and other aspects, features and advantages of the present invention will become more apparent from the following detailed description made with reference to the accompanying drawings. In the drawings.

PREFERRED EMBODIMENTS FOR CARRYING OUT THE INVENTION

First Embodiment

An electric control device according to the present embodiment is shown in FIGS. 1 to 10. The electric control device 1 according to the present embodiment is suitably used for a EPS of a vehicle, for example. Based on a steering torque signal and a vehicle speed signal, the device controls and drives a motor for generating an assist force of a steering wheel.

Figure 1:
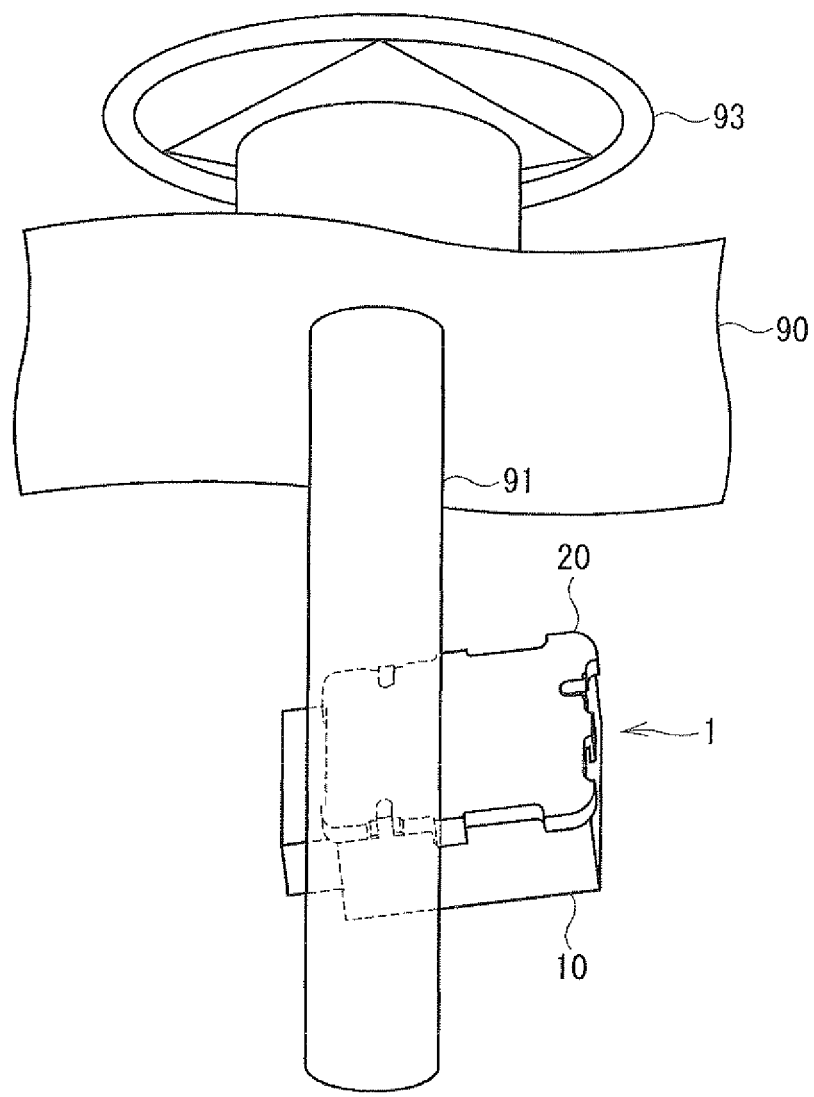
FIG. 1 is a schematic view showing a mounting state of an electric control device according to a first embodiment.

As shown in FIG. 1, the electric control device 1 is disposed on a lower side of the column 91, which is coupled with a steering wheel 92 under a condition that the electric control device 1 is slant with respect to the column 91. The electric control device 1 drives and controls a motor for generating an assisting force of the steering wheel.

Figure 2:
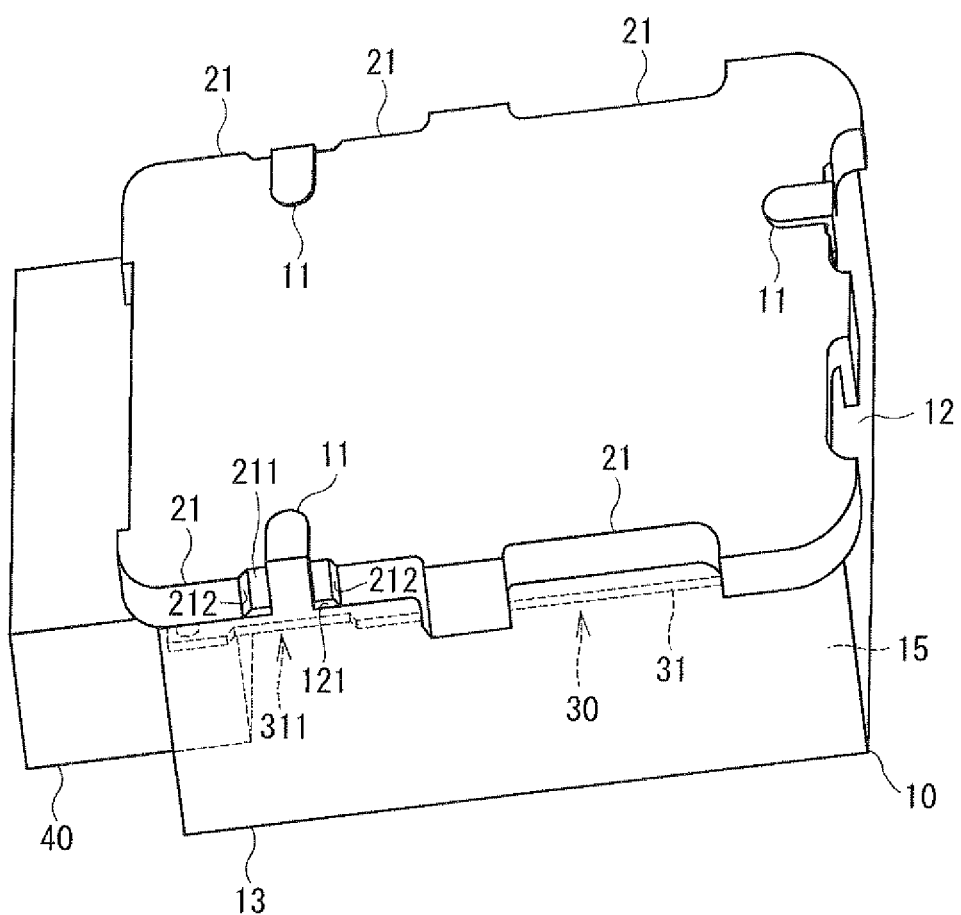
FIG. 2 is a perspective view showing the electric control device according to the first embodiment.

As shown in FIG. 2, the electric control device 1 includes an accommodation element 10, a cover element 20, a hook 11 and a control element 30. In the present embodiment, the electric control device 1 is formed to have a rectangular shape, and is arranged such that four sides of the device 1 is slant with respect to a surface perpendicular to the vertical direction.

Figure 3:
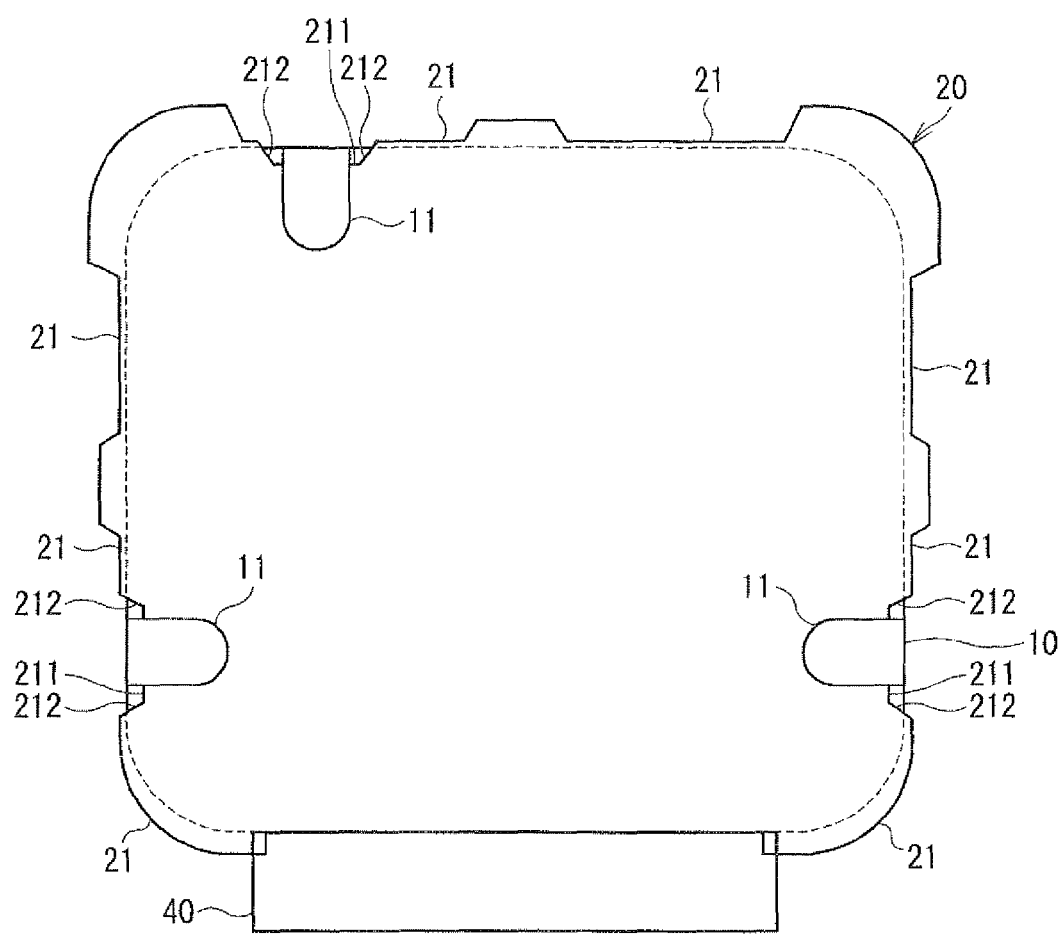
FIG. 3 is a plan view showing the electric control device on a cover element side according to the first embodiment.
Figure 4:
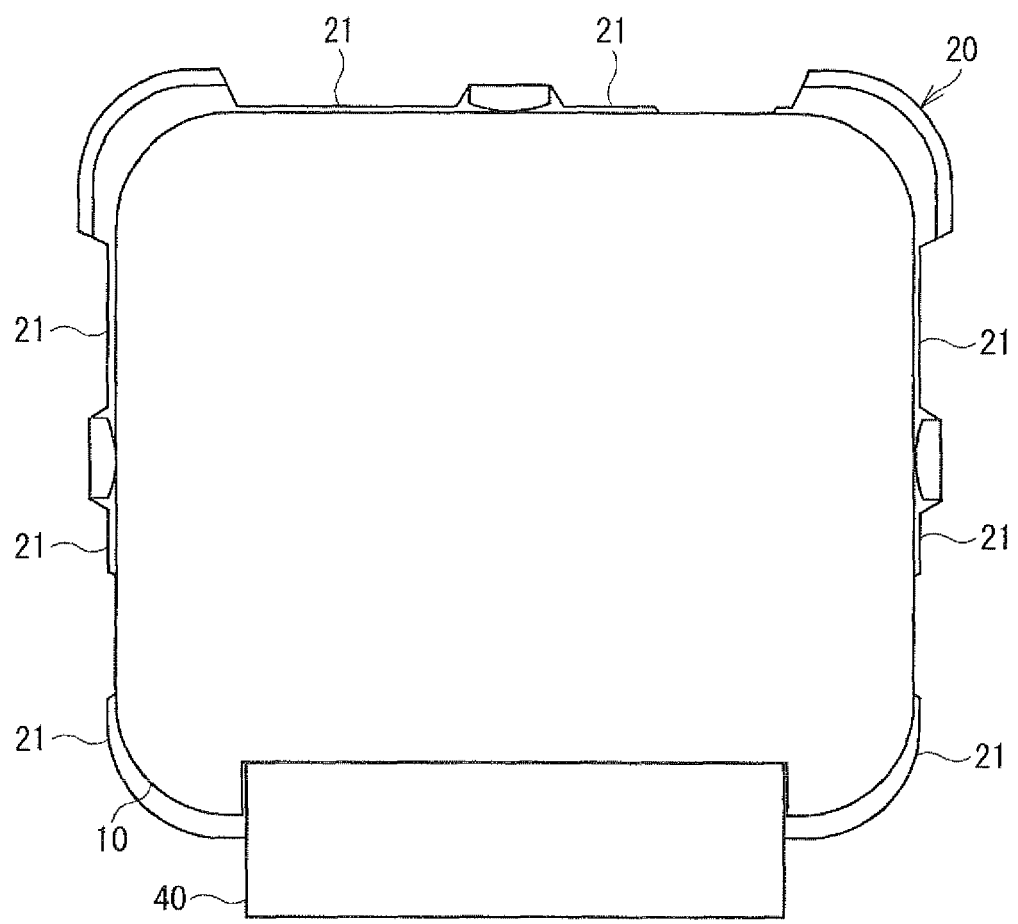
FIG. 4 is a plan view showing the electric control device on an accommodation element side according to the first embodiment.
Figure 5:
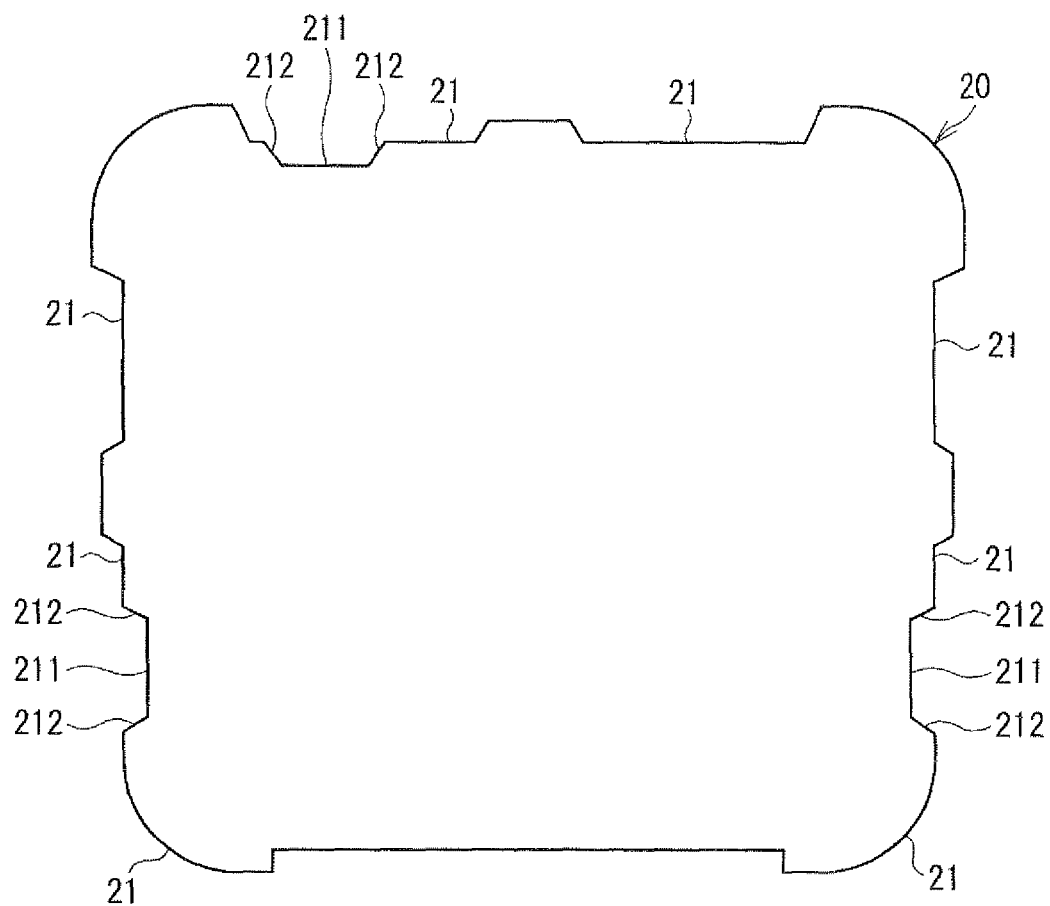
FIG. 5 is a plan view showing a surface of a cover element of the electric control device according to the first embodiment.

The accommodation element 10 is made of metal such as zinc galvanized stainless steel. The accommodation element 10 is a container having a bottom 13 and a side wall 12. The side wall 12 includes the hook 11 disposed on a periphery of an opening opposite to the bottom 13. As shown in FIG. 3, the hook 11 is swaged with respect to the cover element 20 so that the cover element 20 is fixed to the accommodation element 10.

The cover element 20 has a rectangular plate shape, and is made of metal such as aluminum. The cover element 20 closes the opening of the accommodation element 10, so that accommodation space 15 for accommodating the control element 30 is formed. Here, a surface of the cover element 20 on the accommodation element 10 side is defined as a back surface. A surface of the cover element 20 opposite to the back surface is defined as a front surface. Further, a center side of the cover element 20 in a plan direction including the front surface or the back surface of the cover element 20 is defined as an inner side, and a side opposite to the inner side is defined as an outer side.

Figure 6:
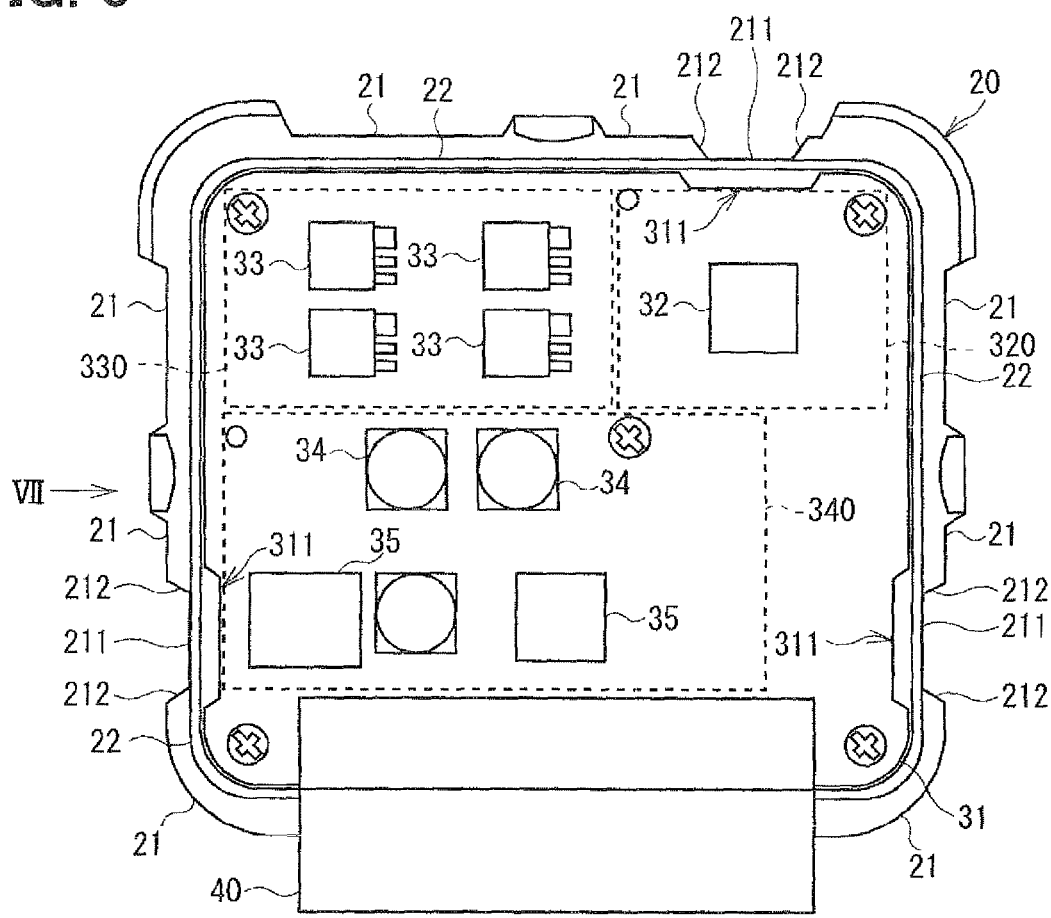
FIG. 6 is a plan view showing a control element of the electric control device according to the first embodiment.

The cover element 20 includes a contact periphery portion 21 contacting a periphery around the opening of the accommodation element 10 and an engagement member 22 engaged with the accommodation element 10 (refer to FIG. 6). The contact periphery portion 21 is formed to protrude and extend toward the outside along with a periphery of the cover element 20. The engagement element 22 protrudes on an inner side of the contact periphery portion 21 to be perpendicular to the back surface of the cover element 20. When the cover element 20 covers the opening of the accommodation element 10, the contact periphery portion 21 contacts the periphery surface 121 of the periphery around the opening of the accommodation element 10, and the outer wall surface 221 of the engagement member 22 faces the inner wall surface 122 of the side wall 12 (refer to FIG. 9).

A hook receiving surface 211 is formed at a position corresponding to the hook 11 of the contact periphery portion 21. The hook receiving surface 211 is formed such that a part of the contact periphery portion 21 is concaved along with the peripheral direction of the contact periphery portion 21. Here, the plane including the hook receiving surface 211 substantially coincides with the plane including the outer wall surface 221 of the engagement member 22 (refer to FIG. 9). A step surface 212 is formed on both sides of the hook receiving surface 211 in the peripheral direction of the contact periphery portion 21.

Figure 7:
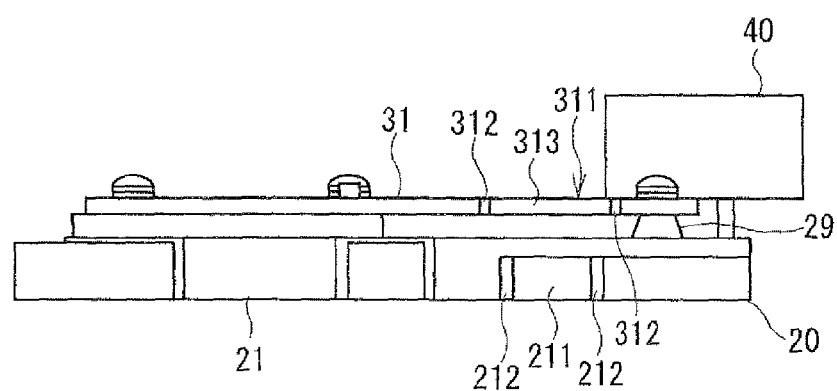
FIG. 7 is a view on arrow in the VII direction in FIG. 6.

As shown in FIG. 6, an electric element such as a micro computer 32, an electric field effect transistor 33, a capacitor 34 and a relay 35 is arranged on the substrate 31 so that the control element 30 is formed. In the present embodiment, a part of the substrate 31, on which the micro computer 32 is arranged, is defined as a control region 320. A part of the substrate 31, on which the electric field effect transistor 33 is arranged, is defined as a power region 330. A part of the substrate 31, on which the capacitor 34 and the relay 35 are arranged, is defined as a sub power region 340. The substrate 31 is fixed to the cover element 20 via a screw, and assembled with the screw assembling member 29, as shown in FIG. 7. The screw is positioned at a location on the substrate where no electric element is arranged.

A notch concavity 311 is formed on a periphery of the control region 320 and the sub power region 340 in the substrate 31. The notch concavity 311 is formed at a position facing the hook 11 and the hook receiving surface 211 in a thickness direction of the substrate 31 (refer to FIG. 9). Here, as shown in FIGS. 6, 7 and 8, the width of the notch concavity 311 in the peripheral direction of the substrate 31 is larger than the width of the hook receiving surface 211 in the peripheral direction of the contact periphery portion 21.

Figure 8:
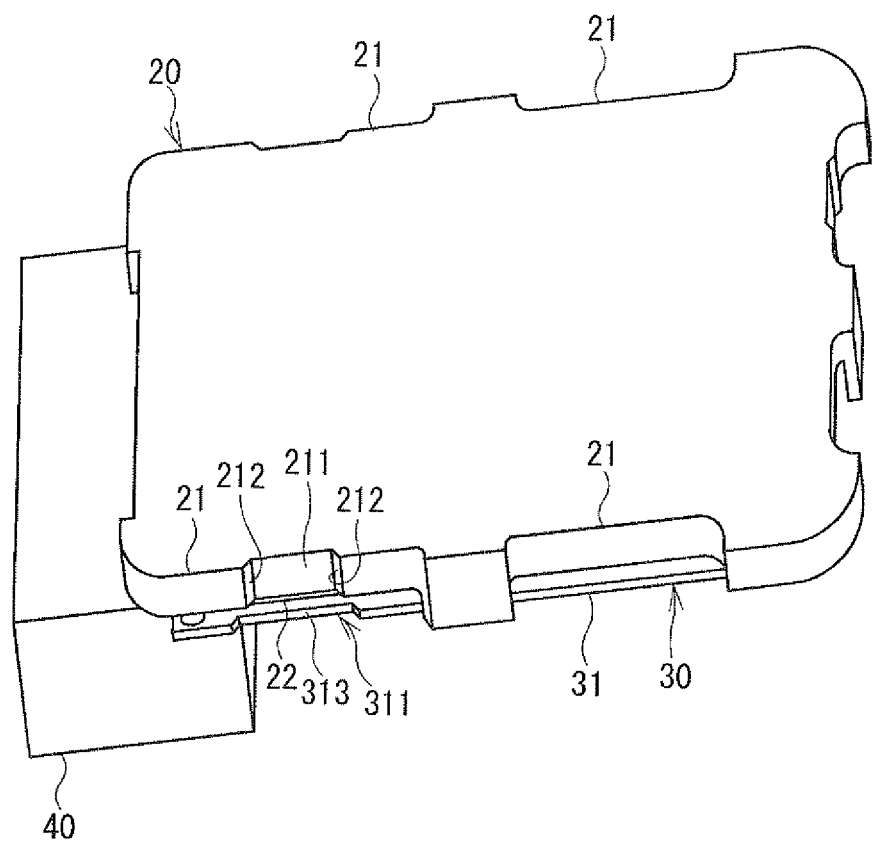
FIG. 8 is a perspective view showing the electric control device under a condition that the accommodation element is removed, according to the first embodiment.
Figure 9:
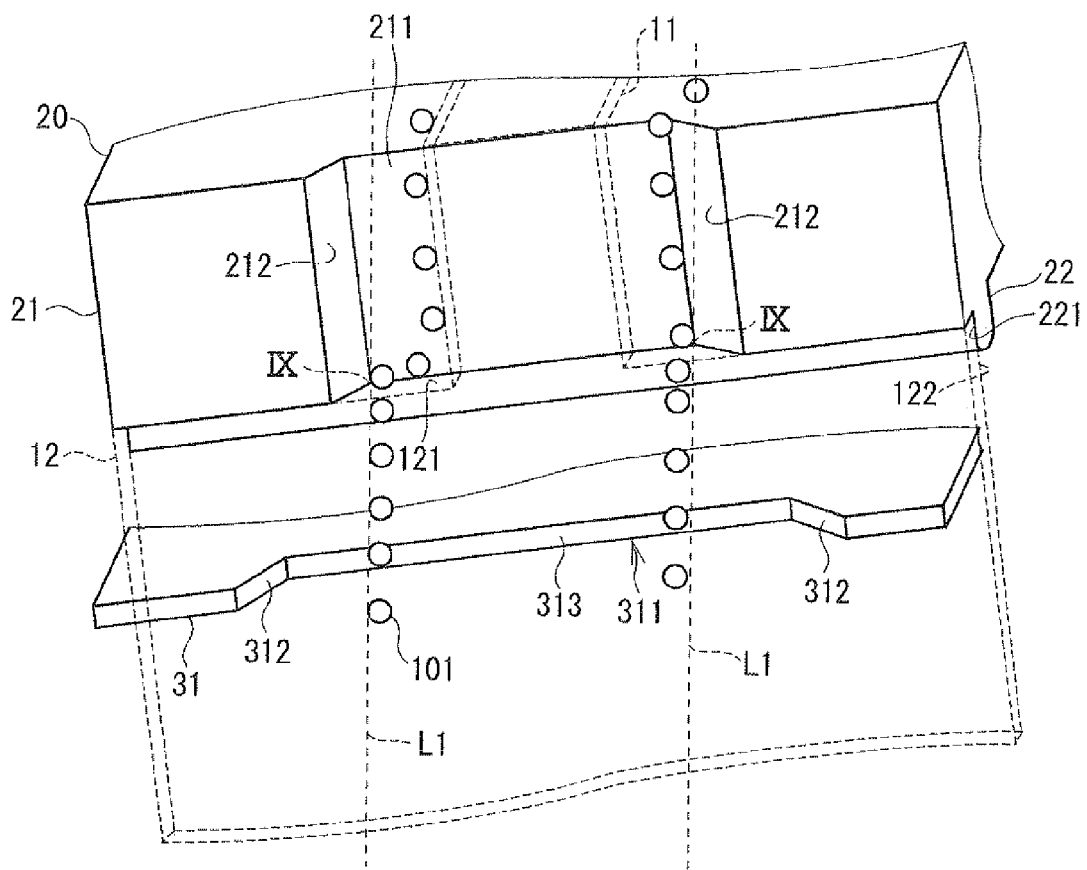
FIG. 9 is an enlarged view showing a main part of the electric control device according to the first embodiment.

As shown in FIGS. 7 and 8, a minimum distance between two groove walls 312 of the notch concavity 311 is larger than a maximum distance between two step surfaces 212. Accordingly, as shown in FIG. 9, the ideal plane including the step surface 212, an ideal surface including the hook receiving surface 211 and an ideal surface including the periphery surface 121 of the periphery around the opening of the accommodation element 10 intersect at an intersection point A, and the vertical line L1 passing through the intersection point A is disposed on the outside of the projection of the substrate having the notch concavity 311 in the vertical direction.

Figure 10A:
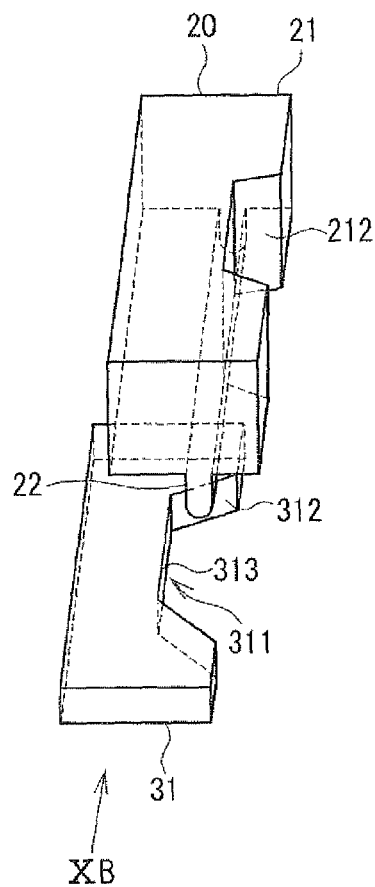
FIG. 10A is an enlarged view showing a main part of the electric control device under a condition that the accommodation element is removed, according to the first embodiment of the present invention.
Figure 10B:
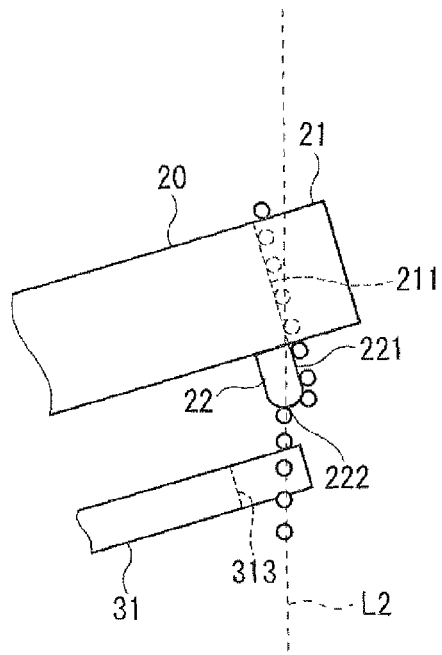
FIG. 10B is a view on arrow in the XB direction in FIG. 10A.

Further, as shown in FIG. 10, the groove bottom 313 of the notch concavity 311 is disposed on a center side of the substrate 31 from the vertical line L2 passing through the top 222 of the engagement member 22 on the accommodation element 10 side.

In the present embodiment, the notch concavity 311 is formed at a position of the periphery of the substrate 31 corresponding to the hook receiving surface 211. Accordingly, even if dew (e.g., condensation water) formed on the column 91, water penetrating through the clearance between the dash board 90 and the column 91 and the like penetrate to the inside of the accommodation element 10 via the clearance between the hook 11 and the cover element 20, the water passes through concavity space formed in the notch concavity 311, which is formed at a position corresponding to the hook 11. Thus, even if the water penetrates to the inside of the accommodation element 10, the water is restricted from adhering to the substrate 31.

The notch concavity 311 is formed on a periphery of the control region 320 and a periphery of the sub power region 340. Thus, the notch concavity 311 is not formed on a periphery of the power region 330. Accordingly, heat mass of the substrate 31 is secured. Thus, heat radiation performance of the power region 330, which easily stores heat, is maintained. The water is restricted from adhering to the substrate 31.

In the present embodiment, the width of the notch concavity 311 in the peripheral direction of the substrate 31 is larger than the width of the hook receiving surface 211 in the peripheral direction of the contact periphery portion 21. Accordingly, even if the water penetrates to the inside of the accommodation element 10 from a periphery penetrates to the inside of the accommodation element 10 from a periphery of the hook 11 around the opening of the accommodation element 10, the water is introduced to the notch concavity 311 or the outside of the substrate 31. Thus, the water is restricted from adhering to the substrate 31.

Further, the ideal plane including the step surface 212, the ideal plane including the hook receiving surface 211 and the ideal plane including the periphery surface 121 of the periphery around the opening of the accommodation element 10 intersect at the intersection point A, and the vertical line L1 passing through the intersection point A is disposed on the outside of the projection of the substrate 31 having the notch concavity 311 in the vertical direction. Accordingly, even if the water drops along with the vertical line L1 passing through the intersection point A among the ideal plane including the step surface 212, the ideal plane including the hook receiving surface 211 and the ideal plane including the periphery surface 121 of the periphery around the opening of the accommodation element 10, the water is restricted from adhering to the substrate 31. Accordingly, even if the water penetrates to the inside of the accommodation element 10, the water does not drop on the substrate 31. Thus, operation failure of the electric control device 1 is restricted.

In the present embodiment, the groove bottom 313 is disposed on the center side of the substrate from the vertical line L2 passing through the top 222 of the engagement member 22 on the accommodation element 10 side. Accordingly, even if the water penetrates to the inside of the accommodation element 10 via the clearance between the hook 11 and the cover element 20, and the penetrated water drops along with the vertical line L2 passing through the top 222, the water is restricted from adhering to the substrate 31.

Second Embodiment

Figure 11:
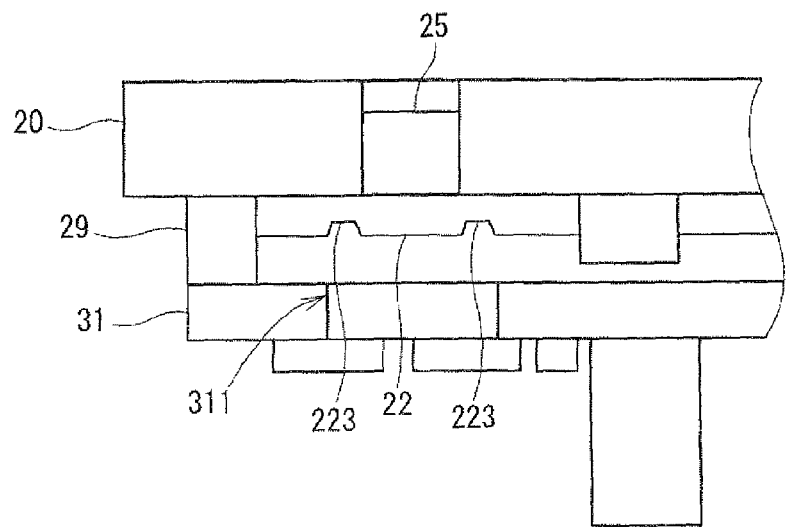
FIG. 11 is a side view showing a main part of an electric control device according to a second embodiment.
Figure 12:
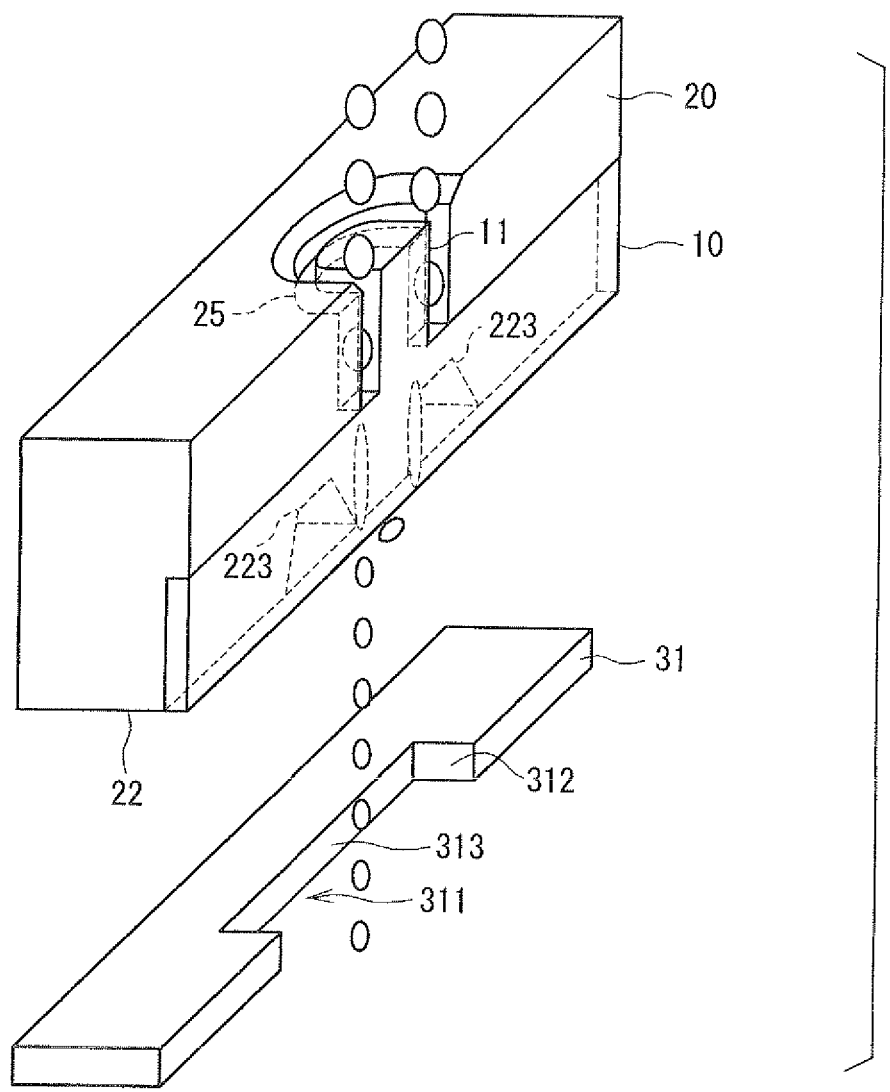
FIG. 12 is a schematic view of the main part of the electric control device according to the second embodiment.

An electric control device 2 according to the present embodiment is shown in FIGS. 11 and 12. Substantially the same feature as the above embodiment has the same reference numeral, and the explanation of the feature is skipped. FIG. 11 is a side view showing a part of the electric control device 2 under a condition that the accommodation element 10 and the connector 40 are removed. As shown in FIG. 11, the cover element 20 includes a hook engagement member 25 at a position corresponding to the hook 11. The hook 11 of the accommodation element 10 engages with the hook engagement member 25, so that the cover element 20 is fixed to the accommodation element 10.

In the present embodiment, the notch concavity 311 is formed in an area corresponding to the hook engagement member 25. It is preferred that a width of a notch of the notch concavity 311 is in a range between 13 millimeters and 15 millimeters, and a depth of the notch of the notch concavity 311 is in a range between 2 millimeters and 3 millimeters.

As shown in FIG. 11, an introduction concavity 223 is formed in the engagement member 22. The introduction concavity 223 is formed such that the projection of the introduction concavity 223 in the vertical direction is disposed between the projection of the substrate having the notch concavity 311 in the vertical direction and the projection of the hook 11 in the vertical direction. In the present embodiment, the shortest distance between two introduction concavities 223 is smaller than the width of the notch concavity 311. Further, as shown in FIG. 11, it is preferred that the introduction concavity 223 is formed in the engagement member 22 between a perpendicular line passing through a top of the hook 11 and a perpendicular line passing through a top of the notch concavity 311.

FIG. 12 is a three-dimensional schematic view showing a periphery of the notch concavity 311 of the substrate 31. As shown in FIG. 12, since the substrate 31 of the electric control device 2 in the present embodiment includes the notch concavity 311, the water that has penetrated between the hook engagement member 25 and the hook 11 is restricted from dropping on the substrate 31. Thus, the simple structure provides a highly water proof effect. Further, since the introduction concavity 223 is formed between the longitudinal direction line passing through the top of the hook 11 and a longitudinal direction line passing through the top of the notch concavity 311, the water is much restricted from dropping on the substrate 31. Here, the introduction concavity 223 corresponds to "a liquid drop introduction member" in claims.

Other Embodiments

I the above embodiments; the liquid drop introduction member is the introduction concavity. In other embodiments, an introduction convexity instead of the introduction concavity may be formed. In this case, the vertical line passing through the top of the introduction convexity is disposed on the outside from the projection of the substrate having the notch concavity in the vertical direction Accordingly, the present invention is not limited to the above embodiments. The present invention can be applied to various embodiments within the scope of claims.

While example embodiments have been described above, it is to be understood that the invention is not limited to the example embodiments and constructions. The invention is intended to cover various modification and equivalent arrangements. In addition, while the various combinations and configurations, which are exemplary, other combinations and configurations, including more, less or only a single element, are also within the spirit and scope of the invention.

The invention claimed is:

1. An electric control device comprising:
an accommodation element as a casing having an opening and a bottom;
a cover element for covering the opening of the accommodation element so that accommodation space is formed between the cover element and the accommodation element;
a hook integrated with the accommodation element for swaging the cover element; and
a control element formed in the accommodation space, wherein an electric element is arranged on a substrate so that the control element is prepared,
wherein the substrate includes a notch concavity on a periphery of the substrate so as to face the hook,
wherein the notch concavity provides concavity space for flowing water even if the water penetrates into the accommodation element,
wherein the concavity space faces the hook,
wherein the substrate is spaced apart from the accommodation element and the cover element in a thickness direction of the substrate,
wherein the notch concavity includes a groove wall and a groove bottom, each of which is spaced apart from the accommodation element and the cover element in a direction perpendicular to the thickness direction of the substrate,
wherein the cover element includes an engagement member for engaging with the accommodation element and a contact periphery portion for contacting a peripheral surface around the opening of the accommodation element,
wherein a hook receiving surface is formed at a position of the contact periphery portion corresponding to the hook, and is concaved to a plane including an outer wall of the engagement member facing an inner wall of the accommodation element,
wherein a width of the notch concavity in the peripheral direction of the substrate is larger than a width of the hook receiving surface in the peripheral direction of the contact periphery portion, and
wherein the contact periphery portion includes a step surface on both sides of the hook receiving surface in a peripheral direction of the contact periphery portion, and
wherein a vertical line passing through an intersection point among an ideal plane including the step surface, an ideal plane including the hook receiving surface and an ideal plane including an end surface of the periphery around the opening of the accommodation element is disposed on an outside of a projection of the substrate with the notch concavity in the vertical direction.

2. The electric control device according to claim 1, wherein a width of the notch concavity in a peripheral direction of the substrate is larger than a width of the hook in a peripheral direction around the opening.

3. The electric control device according to claim 1, wherein a groove bottom portion of the notch concavity is disposed on a center side of the substrate from a vertical line passing through a top of the engagement member on an accommodation element side.

4. The electric control device according to claim 1, wherein the substrate includes a power region in which a driving current for driving a control object flows, a control region in which a control current for controlling the driving current flows, and a sub power region for accumulating and discharging current, and
wherein the notch concavity is formed on at least one periphery of the control region and the sub power region.

5. The electric control device according to claim 1, wherein a liquid drop introduction member is formed on both sides of a position of the engagement member corresponding to the hook, and
wherein a projection of the liquid drop introduction member in the vertical direction is disposed on an outside, along with a horizontal direction, of a projection of the substrate having the notch concavity in the vertical direction.

6. An electric control device comprising:
an accommodation element as a casing having an opening and a bottom;
a cover element for covering the opening of the accommodation element so that accommodation space is formed between the cover element and the accommodation element;
a hook integrated with the accommodation element for swaging the cover element; and
a control element formed in the accommodation space, wherein an electric element is arranged on a substrate so that the control element is prepared,
wherein the substrate includes a notch concavity on a periphery of the substrate so as to face the hook,
wherein the notch concavity provides concavity space for flowing water even if the water penetrates into the accommodation element, and
wherein the concavity space faces the hook,
wherein the cover element includes an engagement member for engaging with the accommodation element and a contact periphery portion for contacting a peripheral surface around the opening of the accommodation element,
wherein a hook receiving surface is formed at a position of the contact periphery portion corresponding to the hook, and is concaved to a plane including an outer wall of the engagement member facing an inner wall of the accommodation element, and
wherein a width of the notch concavity in the peripheral direction of the substrate is larger than a width of the hook receiving surface in the peripheral direction of the contact periphery portion,
wherein the contact periphery portion includes a step surface on both sides of the hook receiving surface in a peripheral direction of the contact periphery portion, and
wherein a vertical line passing through an intersection point among an ideal plane including the step surface, an ideal plane including the hook receiving surface and an ideal plane including an end surface of the periphery around the opening of the accommodation element is disposed on an outside of a projection of the substrate with the notch concavity in the vertical direction.

7. An electric control device comprising:

an accommodation element as a casing having an opening and a bottom;

a cover element for covering the opening of the accommodation element so that accommodation space is formed between the cover element and the accommodation element;

a hook integrated with the accommodation element for swaging the cover element; and a control element formed in the accommodation space, wherein an electric element is arranged on a substrate so that the control element is prepared, wherein the substrate includes a notch concavity on a periphery of the substrate so as to face the hook, wherein the notch concavity provides concavity space for flowing water even if the water penetrates into the accommodation element, and wherein the concavity space faces the hook, wherein the cover element includes an engagement member for engaging with the accommodation element and a contact periphery portion for contacting a peripheral surface around the opening of the accommodation element, wherein a hook receiving surface is formed at a position of the contact periphery portion corresponding to the hook, and is concaved to a plane including an outer wall of the engagement member facing an inner wall of the accommodation element, and wherein a width of the notch concavity in the peripheral direction of the substrate is larger than a width of the hook receiving surface in the peripheral direction of the contact periphery portion, wherein a liquid drop introduction member is formed on both sides of a position of the engagement member corresponding to the hook, and wherein a projection of the liquid drop introduction member in the vertical direction is disposed on an outside, along with a horizontal direction, of a projection of the substrate having the notch concavity in the vertical direction.

* * * * *